(12) United States Patent
Bueti et al.

(10) Patent No.: US 7,519,941 B2
(45) Date of Patent: Apr. 14, 2009

(54) METHOD OF MANUFACTURING INTEGRATED CIRCUITS USING PRE-MADE AND PRE-QUALIFIED EXPOSURE MASKS FOR SELECTED BLOCKS OF CIRCUITRY

(75) Inventors: Serafino Bueti, Waterbury, VT (US); Kenneth J. Goodnow, Essex Junction, VT (US); Gregory J. Mann, Winfield, IL (US); Jason M. Norman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 11/279,666

(22) Filed: Apr. 13, 2006

(65) Prior Publication Data
US 2007/0245290 A1  Oct. 18, 2007

(51) Int. Cl.
*G07F 17/50* (2006.01)
(52) U.S. Cl. .............................. 716/21; 716/5; 716/19
(58) Field of Classification Search ................. 716/4–5, 716/19–21; 430/5, 30
See application file for complete search history.

(56) References Cited

U.S. PATENT DOCUMENTS

| 5,227,269 | A | 7/1993 | Scott |
| 5,550,839 | A | 8/1996 | Buch et al. |
| 6,134,704 | A | 10/2000 | Adams et al. |
| 6,171,736 | B1 | 1/2001 | Hirayanagi |
| 6,200,709 | B1 | 3/2001 | Nuytkens et al. |
| 6,421,111 | B1 | 7/2002 | Pierrat |
| 6,490,707 | B1 | 12/2002 | Baxter |
| 6,492,077 | B1 | 12/2002 | Lin |
| RE38,126 | E | 5/2003 | Tew et al. |
| 6,654,945 | B1 * | 11/2003 | Nakayama et al. ............ 716/18 |
| 6,803,178 | B1 | 10/2004 | Subramanian et al. |
| 7,302,672 | B2 * | 11/2007 | Pack et al. .................... 716/19 |
| 2003/0142284 | A1 | 7/2003 | Lin |
| 2004/0229135 | A1 | 11/2004 | Wang et al. |
| 2005/0216877 | A1 | 9/2005 | Pack et al. |
| 2007/0196958 | A1 * | 8/2007 | Bhattacharya et al. ...... 438/128 |

OTHER PUBLICATIONS

Ed Sperling, "Intellectual Capital: EN Interviews Aart de Geus," Electronic News, Jul. 1, 2004, 4 pages.

* cited by examiner

*Primary Examiner*—Vuthe Siek
(74) *Attorney, Agent, or Firm*—Gibb I.P. Law Firm, LLC; Richard M. Kotulak, Esq (57) ABSTRACT

Disclosed are embodiments of a manufacturing method that establishes a library of pre-made and pre-qualified masks for patterning different blocks of circuitry that meet established performance and timing requirements. The embodiments of the method use stepped exposures of multiple masks, including at least one mask selected from this library, to pattern a chip design onto a silicon wafer, where the chip design is made up of two or more interconnected blocks of circuitry. Consequently, for a given integrated circuit design, pre-made/pre-qualified mask(s) can be selected from the library to pattern one, some or all blocks of circuitry for the design. Optionally, additional masks can be specially made and qualified to pattern other block(s) of circuitry (e.g., application specific logic) within the design. The blocks of circuitry patterned in this manner can be electrically connected via generic or customized interfaces in order to complete the chip design.

16 Claims, 4 Drawing Sheets

METHOD OF MANUFACTURING INTEGRATED CIRCUITS USING PRE-MADE AND PRE-QUALIFIED EXPOSURE MASKS FOR SELECTED BLOCKS OF CIRCUITRY

BACKGROUND

1. Field of the Invention

The embodiments of the invention generally relate to the manufacturing of integrated circuits and, more particularly, to exposure masks used for transferring circuit patterns to an integrated circuit wafer.

2. Description of the Related Art

Integrated circuit (IC) design and manufacturing flow in place today is defined and implemented to build masks that define particular chip designs. Specifically, standard practice in the manufacturing industry today is to release a chip design to a mask house that builds a common set of masks that can be used to manufacture that chip design. Improvements over this conventional manufacturing process have generally focused on the development of new masks and exposure techniques and several alternative approaches to the manufacturing process itself have also been proposed and implemented. For example, one approach is to build separate chips for specific functions (e.g., memories, computer processing units, etc.) and to connect those separate chips together on a substrate carrier, such as a multi-chip module (MCM). The MCM approach, however, adds performance penalties, packaging complexities and costs. Other alternative approaches have included the use of different masks to process separate areas of the chip at the same time (e.g., different masks for manufacturing large memory technologies when chip areas exceeded the limits of wafer exposure tool capabilities). The wafer expose tools are capable of aligning different shapes processed using different masks by implementing relaxed overlay rules (e.g., double width wires at overlay boundaries) in order to allow for proper and adequate alignments. Still other alternative approaches having included using multiple reticles on the same chip without the need to reload masks or add additional steps during chip/wafer exposure. Yet another approach is to connect separate intellectual property (IP) logic (i.e., blocks of circuitry designed for specific critical functions) to other circuitry within the chip without need for alignment ground rule relaxation through a low power wireless intra-chip network.

However, as technology geometries decrease to submicron dimensions, the development effort, costs, and qualification efforts for very large and complex designs and risks, increase considerably. For even smaller geometries, the shapes that need to be designed on a mask must have particular characteristics that may differ depending on the surrounding shapes. For example, a rectangular shape may have different dimensions and characteristics depending on the densities surrounding it. This creates a problem in today's manufacturing, even in light of the alternative approaches to manufacturing set out above, and it will be an even greater problem for the advanced leading edge technologies of the future. That is, as integrated circuit dimensions continue to decrease and densities continue to increase, the costs and processing times associated with manufacturing integrated circuits so that they meet required timing and performance standards will continue to rise.

Therefore, there is a need in the art for new development and manufacturing methodologies that will minimize these issues and improve the capability of first time success, while potentially reducing costs and Turn Around Time (TAT). More specifically, there is a need in the art for a middle of the road approach that will result in the performance of a full chip design approach and the yield capability of the MCM approach.

SUMMARY

In view of the foregoing, disclosed herein are embodiments of a manufacturing method that establishes and maintains a library of pre-made and pre-qualified masks for patterning different blocks of circuitry with varying structures that meet established performance and timing requirements. The embodiments of the method further use exposures of multiple masks, including at least one mask selected from the library, to pattern an entire integrated circuit design onto a substrate. Consequently, for a given integrated circuit design, pre-made/pre-qualified mask(s) can be selected from the library to pattern one, some or all blocks of circuitry for the design. Optionally, additional masks can be specially made and qualified to pattern other block(s) of circuitry within the design. The blocks of circuitry patterned in this manner can be electrically connected to complete the integrated circuit design. Using pre-made and pre-qualified masks ensures optimal mask quality. While using multiple masks allows more stringent rules to be applied to more critical circuits and more relaxed rules to be applied to less critical circuits, thereby, improving integrated circuit production line yields.

More particularly, the method comprises first setting-up a library of pre-made and pre-manufactured masks for patterning different blocks of circuitry with varying structures that meet established performance and timing requirements. In order to set-up this library, different blocks of circuitry, each having established timing and performance requirements, are designed and selected for inclusion in the library. The library should be established such that it contains many of the core or generic blocks of circuitry often required for integrated circuits. For example, these different blocks of circuitry can include devices, processors, systems-on-a-chip, serial links, memory structures, programmable logic, phase-locked loops (PLLs), input/output (IO) circuits, etc.

Then, the structures for these blocks of circuitry are laid out and masks for patterning them are designed, made and qualified. That is, for each block, predetermined mask specifications and sets of rules for mask formation and processing are established and verified so that any blocks that are eventually formed using these masks will meet the established timing and performance requirements. The masks are then formed according to the design using traditional or other mask formation techniques.

Optionally, each block and corresponding mask can be specifically designed so that when the block of circuitry is formed in the substrate, the block can be connected to a common generic interface and, thereby, interconnected with other blocks of circuitry.

As each mask is formed, it can be inspected to determine if it meets the predetermined design specifications (i.e., to determine if it was formed with any errors). Masks that fail to meet the predetermined design specifications can be reformed and re-inspected, as necessary.

Each of the masks can then be individually qualified. That is, a specific mask for a specific block of circuitry can be selected for qualification. Qualification can be accomplished by performing lithographic exposures using the specific mask (i.e., building a test vehicle or test chip) and then, taking critical dimension (CD) measurements of the resulting substrate images. The images can be compared to the predetermined specifications set forth in the design and process documentation in order to determine if an error was made in either the process of forming the specific mask and/or in the process of designing the specific mask. If a determination is made that an error occurred in the process of forming the specific mask, then that process can be repeated as well as the inspection and qualification processes. If a determination is made that an error occurred in the design process, then that process can be repeated as well as the formation, inspection and qualification processes. The qualification steps of the masks can also include electrical testing of the test chips including the masks being qualified to ensure that the intended functionality, performance, quality, and reliability, etc. are met.

After the masks are qualified, these pre-made and pre-qualified masks can be maintained in a library for subsequent use. Specifically, the method further comprises using exposures of multiple masks, including at least one mask selected from this library, to pattern an entire integrated circuit design onto a substrate, where the integrated circuit design is made up of multiple interconnected blocks of circuitry. In order to accomplish this, the integrated circuit is designed so that it comprises at least two blocks of circuitry. The multiple blocks can include at least one core or generic block of circuitry (i.e., a first block of circuitry), such as, a device, a processor, a system-on-a-chip, or a serial link. The multiple blocks can also include at least one block of application specific circuitry (e.g., a second block of circuitry), such as, programmable or application specific logic. To design the integrated circuit, determinations are made regarding what blocks of circuitry will be required for the integrated circuit, what the timing and performance requirements for those blocks should be, what the specifications for those blocks should be, what the layout for those blocks should be, how those blocks should be electrically connected, etc.

Once the integrated circuit is designed, the required blocks of circuitry (e.g., the first block and the second block) are either selected from a library of pre-made and pre-qualified masks (as described above) or are custom-made and qualified specifically for the design.

It is anticipated that since different timing and performance requirements can apply to different blocks of circuitry and multiple masks will be used to pattern the different blocks, different sets of rules can be used when forming and processing the different masks, whether they are pre-made and qualified or specially made and qualified. For example, if a first block is designed to have a circuit with critical timing and/or performance requirements and a second block is designed to have less critical timing and/or performance requirements, then the set of rules that are applied to forming and processing a first mask for the first block (e.g., a first mask that is selected from the library) can be more stringent than the set of rules that are applied to forming and processing a second mask for the second block (e.g., a second mask that is specially made and qualified). By allowing different rules to be applied based on performance and timing requirements, integrated circuit production line yields can be improved.

Once the masks are selected from the library and/or custom-made and qualified, the various patterns from the various masks can be transferred into a substrate. That is, a first pattern for the first block of circuitry can be transferred into a substrate using the first mask (i.e., a pre-made and pre-qualified mask) and a second pattern for the second block of circuitry can be transferred into the substrate using the second mask (i.e., either another pre-made and pre-qualified mask or a specially made and qualified mask). Once the blocks of circuitry are formed in the substrate, they can be electrically connected according to the design (e.g., via customized or generic interfaces in the substrate) in order to complete the integrated circuit structure.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, as technology geometries decrease to submicron dimensions, the development effort, costs, and qualification efforts for very large and complex designs and risks, increase considerably. For even smaller geometries, the shapes that need to be designed on a mask must have particular characteristics that may differ depending on the surrounding shapes. For example, a rectangle may have different dimensions and characteristics depending on the densities surrounding it. This creates a problem in today's manufacturing and it will be an even greater problem for the advanced leading edge technologies of the future. Therefore, there is a need in the art for new development and manufacturing methodologies that will minimize these issues and improve the capability of first time success, while potentially reducing costs and Turn Around Time (TAT). More specifically, there is a need in the art for a middle of the road approach that will result in the performance of a full chip design approach and the yield capability of the MCM approach.

To improve quality and reduce costs of building masks and silicon chips in future advanced technologies, disclosed herein are embodiments of a method manufacturing integrated circuits (ICs) by developing and using a library of masks that can implement different blocks of circuitry (e.g., circuitry blocks related to specific intellectual property (IP) within the design), the same blocks of circuitry or a mixed group of circuitry blocks. These masks (i.e., IP Masks) can be designed, manufactured, tested, and qualified for highly used and critical blocks of circuitry and can be used in conjunction with other specially made masks that are based on customer logic design. Then, ICs can be formed using multiple mask exposures to manufacture chip designs onto silicon wafers. By implementing the embodiments of the invention, the most critical blocks of circuitry could be designed and built using more stringent rules requirements, while the rules for the majority of the rest of the masks (e.g., customer specific logic design masks) would be more relaxed in order to assist mask build and IC production line yields.

Figure 1:
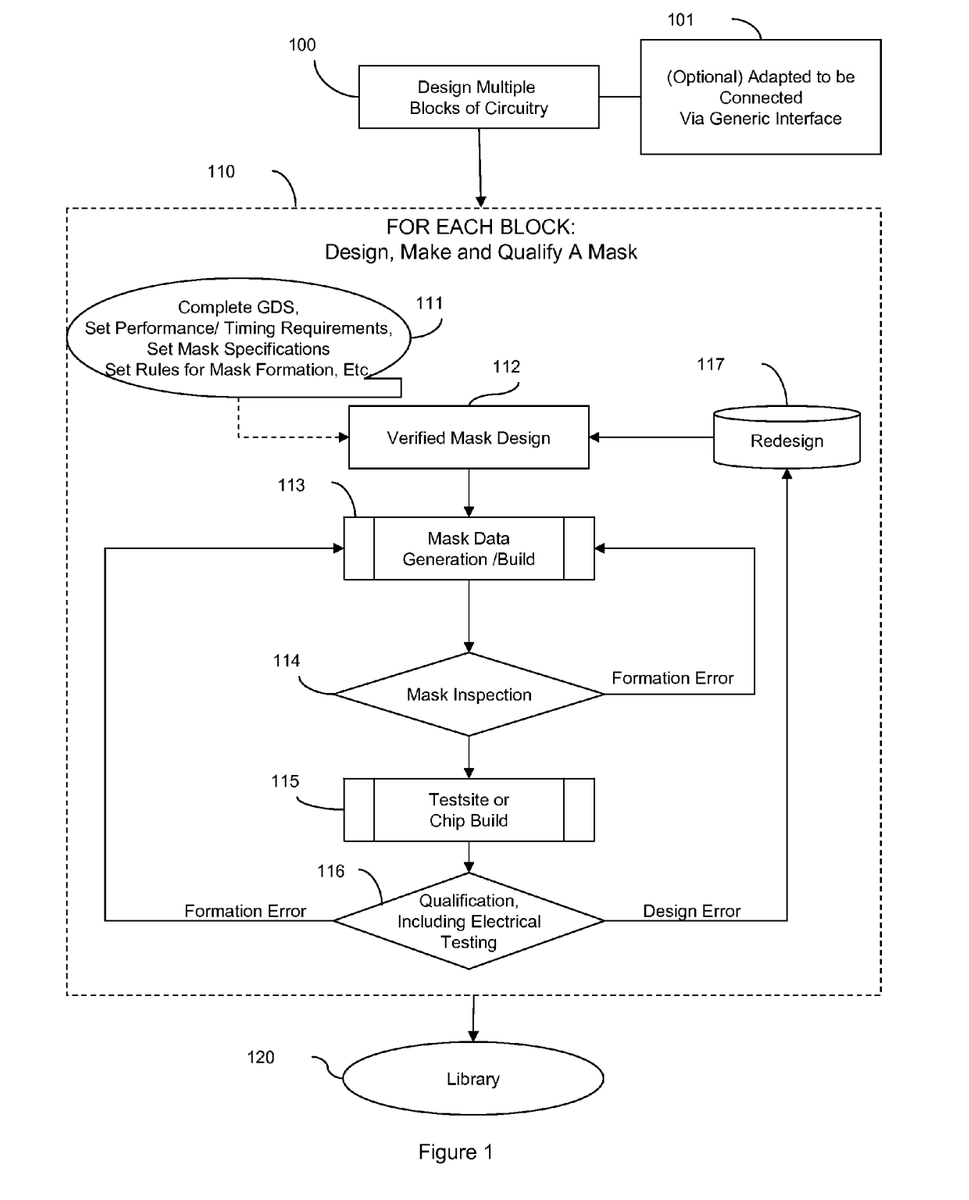
FIG. 1 is a flow diagram illustrating an embodiment of the method of the invention.

More particularly, disclosed herein are embodiments of a manufacturing method that establishes and maintains a library of pre-made and pre-qualified masks for patterning different blocks of circuitry with varying structures that have established performance and timing requirements (see FIG. 1). The disclosed embodiments of the method further use exposures of multiple masks, including at least one mask selected from the library, to pattern an entire integrated circuit design (i.e., chip) onto a substrate (i.e., a section of a wafer), where the integrated circuit design is made up of two or more interconnected blocks of circuitry (see FIG. 2). Consequently, referring to FIG. 3, for a given integrated circuit design (e.g., chip 300), pre-made/pre-qualified mask(s) can be selected from the library to pattern one, some or all blocks of circuitry (e.g., blocks 301 and 303) for the design. Optionally, additional masks can be specially made and qualified to pattern other block(s) of circuitry (e.g., block 302) within the design or a portion of the design can follow the standard practice used today (e.g., in use with ASIC chips) because these blocks are not critical and/or this is logic an ASIC customer would design following the standard flows). The blocks of circuitry 301-303 patterned in this manner can be electrically connected (e.g., via customized interfaces or generic interfaces in the substrate 350), thereby, completing the integrated circuit 300 design. Using pre-made and pre-qualified masks ensures optimal mask quality. While using multiple masks allows more stringent rules to be applied to more critical circuits (e.g., block 301) and more relaxed rules to be applied to less critical circuits (e.g., block 302), thereby, improving integrated circuit production line yields.

More particularly, referring to FIG. 1, the method comprises establishing a library 120 of pre-made and pre-manufactured masks for patterning different blocks of circuitry with varying structures that have established performance and timing requirements. In order to establish this library 120, different blocks of circuitry, each with established timing and performance requirements, are designed and selected for inclusion in the library (100). The library should be established such that it contains many of the core or generic blocks of circuitry often required for integrated circuits. For example, these different blocks of circuitry can include devices (e.g., a universal serial bus (USB)), processors (e.g., a power PC (PPC) processor or PPC processor with peripherals), systems-on-a-chip (SOCs), serial links (e.g., a high speed serial (HSS) link), memory structures, programmable logic, phase-locked loops (PLLs), input/output (IO) circuits and/or circuits with critical timing or performance requirements.

Then, using graphic design software the structures for these blocks of circuitry are laid out and masks for patterning them are designed, made and qualified (110). That is, for each block, predetermined mask specifications and sets of rules for mask formation and processing are established (111) and verified (112) so the blocks that are eventually formed using these masks will meet the established timing and performance requirements. The masks are then formed (113) according to the design using traditional or other mask formation techniques.

Figure 4:
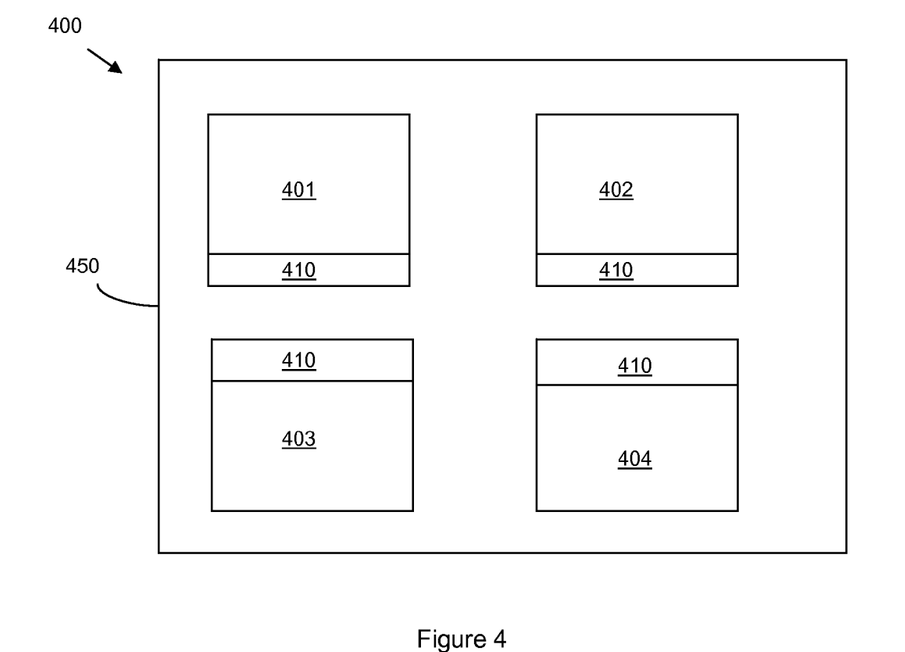
FIG. 4 is a schematic diagram illustrating a top view of another exemplary integrated circuit formed according to the method of the invention.

Optionally, referring to FIG. 4, each block 401-404 and corresponding mask can be specifically designed so the when the blocks of circuitry 401-404 are formed in the substrate 450, they can be connected to a common generic interface 410 and, thereby, interconnected with other blocks of circuitry in order to complete an integrated circuit design (101). The generic interface can be adapted to provide a common configurable structure that enables connections across the different blocks that are implemented as separate masks and support a predefined logic and physical connection.

Referring again to FIG. 1, as each mask is formed, it can be inspected (e.g., visually) to determine if it meets the predetermined design specifications (i.e., to determine if it was formed with any errors or flaws or if it was formed according to the design) (114). Masks that fail to meet the predetermined design specifications can be reformed (at process 113) and re-inspected (at process 114), as necessary.

Each of the masks can then be individually qualified (115-116). That is, a specific mask for a specific block of circuitry can be selected for qualification. Qualification can be accomplished by performing lithographic exposures using the specific mask (i.e., building a test vehicle or test chip (115)) and then, taking critical dimension (CD) measurements of the resulting substrate images. The images can be compared to the predetermined specifications set forth in the design and process documentation in order to determine if an error was made in either the process of forming the specific mask and/or in the process of designing the specific mask (116). If a determination is made that an error occurred in the process of forming the specific mask, then that process (113) can be repeated as well as the inspection and qualification processes. If a determination is made that an error occurred in the design process, then that process can be repeated (i.e., redesign the mask (117)) as well as the formation, inspection and qualification processes. Thus, as discussed earlier, mask qualification can include building the masks functions (i.e., test chips) planned for the library (115) and characterizing them to ensure that functional, electrical, quality, and reliability requirements are met (i.e., electrically testing the test chips) (116).

After the masks are qualified (at process 116), they can be maintained in a library 120 for subsequent use. Specifically, referring to FIG. 2, the method further comprises using exposures of multiple masks, including at least one mask selected from this library, to pattern an entire integrated circuit design onto a substrate (i.e., to pattern a chip design onto a designated section of a silicon wafer), where the integrated circuit or chip design is made up of multiple interconnected blocks of circuitry. In order to accomplish this, the integrated circuit is designed so that it comprises at least two blocks of circuitry (200). The multiple blocks can include at least one core or generic block of circuitry (i.e., a first block of circuitry) such as, a device (e.g., a universal serial bus (USB)), a processor (e.g., a power PC (PPC) processor or a PPC processor with peripherals), a system-on-a-chip (SOC), or a serial link (e.g., a high speed serial (HSS) link) (201). The multiple blocks can also include at least one block of application specific circuitry (e.g., a second block of circuitry). Such application specific circuitry can include programmable logic (e.g., a field programmable gate array area having fuses that can be blown on demand at the back end of the line to meet application specific requirements) or application specific logic (202). To design the integrated circuit, determinations are made regarding what blocks of circuitry will be required for the integrated circuit, what the timing and performance requirements for those blocks should be, what the specifications for those blocks should be, what the layout for those blocks should be, how those blocks should be electrically connected, etc. (203).

Figure 2:
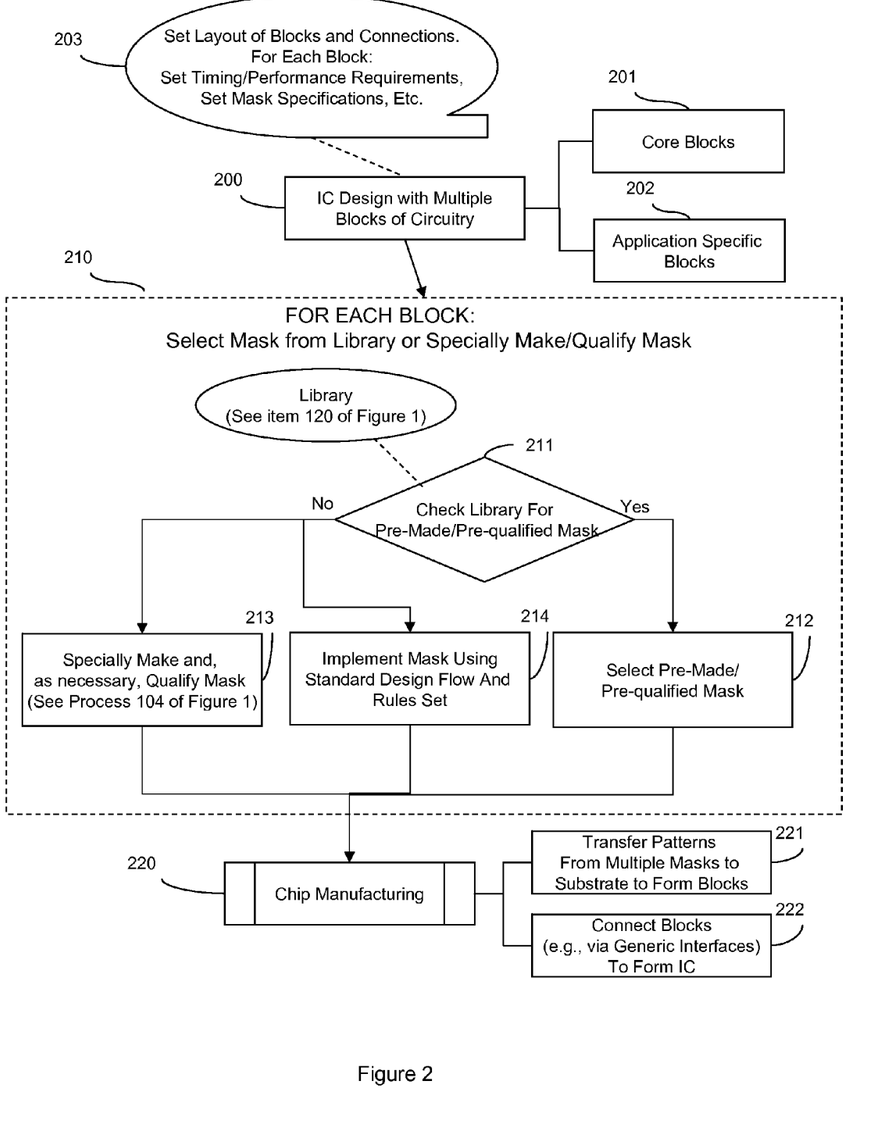
FIG. 2 is a flow diagram further illustrating the embodiment of FIG. 1.

Once the integrated circuit is designed (at process 200), the required blocks of circuitry (e.g., the first block and the second block) are either selected from a library (see library 120 of FIG. 1) of pre-made and pre-qualified masks (as described above) (212) or are custom-made and qualified specifically for the design (213). That is, the library can be checked to determine if any pre-made and pre-qualified masks that are contained in the library 120 are suitable for patterning all or some of the blocks circuitry in the design (211). If so, those pre-made and pre-qualified masks can be selected (212). Masks for any blocks that are required for the design but that are not found contained in the library 120 (at process 211) can be specially made and qualified (e.g., as described above at process 110) (213) or implemented following a standard design flow and rules set (214).

More specifically, as mentioned above, the library should contain many of the core or generic blocks of circuitry currently required for integrated circuits. Thus, referring to FIG. 3, if the first block 301 of circuitry is a core or generic block of circuitry, a pre-made and pre-qualified mask for the first block 301 is likely to be contained in the library 120. If the second block 302 of circuitry is designed with programmable logic (e.g., field programmable gate arrays) or application specific logic to meet application specific requirements, the second mask for this second block 302 may or may not be generic enough to be contained in the library and, thus, may have to either be custom made and qualified, as necessary depending on the performance requirements (213) or implemented according to a standard design flow and rules set (214). Qualification of masks that are not found in the library may not be required, as a customer could consider the final chip as the qualification vehicle because the logic built from these masks would be unique to such a design and never used again, except for in chip revisions.

It is anticipated that since different timing and performance requirements can apply to different blocks of circuitry and multiple masks will be used to pattern the different blocks, different sets of rules (e.g., for the process, the layout, the masks specifications, etc.) can be used when forming and processing the different masks, whether they are pre-made and pre-qualified, custom-made or implemented using a standard design flow. For example, if a first block is designed to have a circuit with critical timing and/or performance requirements and a second block is designed to have less critical timing and/or performance requirements, then the set of rules that are applied to forming and processing a first mask for the first block (e.g., a first mask that is selected from the library) can be more stringent than the set of rules that are applied to forming and processing a second mask for the second block (e.g., a second mask that is specially made and qualified). By allowing different rules to be applied, based on performance and timing requirements, integrated circuit production line yields can be improved.

Once the masks are selected from the library and/or custom-made and/or implemented using standard design flow (at processes 210-214), chip manufacturing can continue (at process 220). Specifically, separate stepped lithographic exposures can be performed in order to transfer the various patterns from the various masks into a substrate (e.g., into designated sections of a silicon wafer) (221). That is, a first pattern for the first block of circuitry can be transferred into a substrate using the first mask (i.e., a pre-made and pre-qualified mask) and then a second pattern for the second block of circuitry can be transferred into the substrate using the second mask (i.e., either another pre-made and pre-qualified mask or a specially made and qualified mask). Once the blocks of circuitry are formed in the substrate, they can be electrically connected according to the design (e.g., via customized or generic interfaces in the substrate) in order to complete the integrated circuit structure (222).

Figure 3:
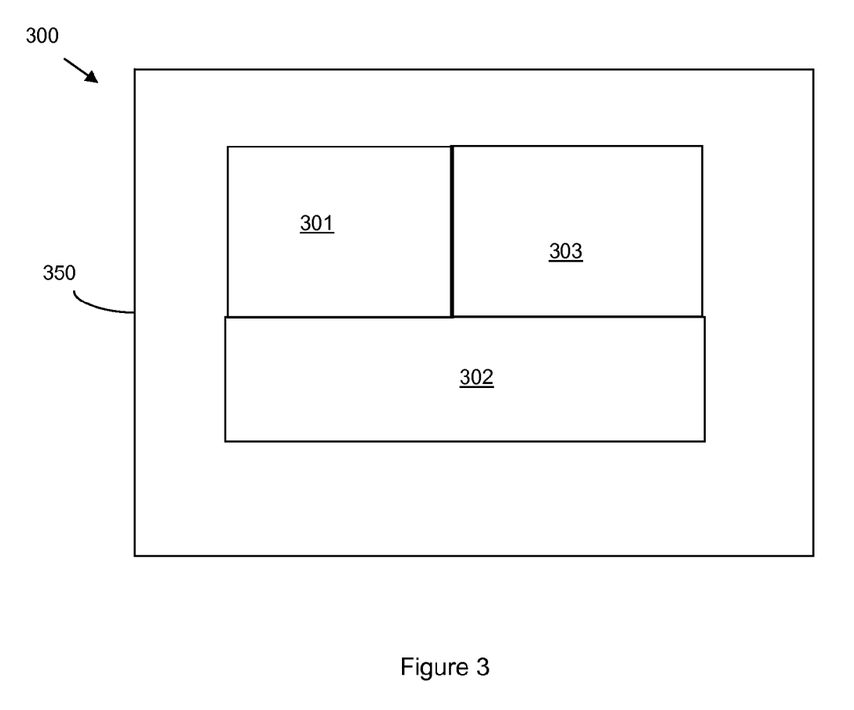
FIG. 3 is a schematic diagram illustrating a top view of an exemplary integrated circuit formed according to the method of the invention.

Referring to FIG. 3, it is anticipated that the embodiments of the methodology, described above and illustrated in FIGS. 1-2, could easily support the manufacturing of application specific integrated circuit (ASIC) chips, for example, or other chips development and manufacturing flows. For example, the customer would design and release the chip essentially in the same manner as it is being done today, by doing RTL design, timing, and GDS (at processes 200-203 of FIG. 2). Process 211 would be followed to determine what masks in the design are supported in the library 120 and what masks are not. For example, if masks for core logic 301 and 303 of chip 300 are found in the library 120, those pre-made and pre-qualified masks would be selected at process 212. If masks for customer logic section 302 of the chip 300 were not found in the library 120, a mask or masks for section 302 would be manufactured using a standard design flow and rules set (214). The mask(s) that encompasses only the customer logic section 302 can be designed so that it is less dense, simpler, and less costly, than if a single mask were customized to encompass the entire chip 300 design. Then, masks implemented at process 213 for section 302 using a standard design flow and any masks selected from the library at process 212, would simultaneously be released for manufacturing at process 220.

Figure 5:
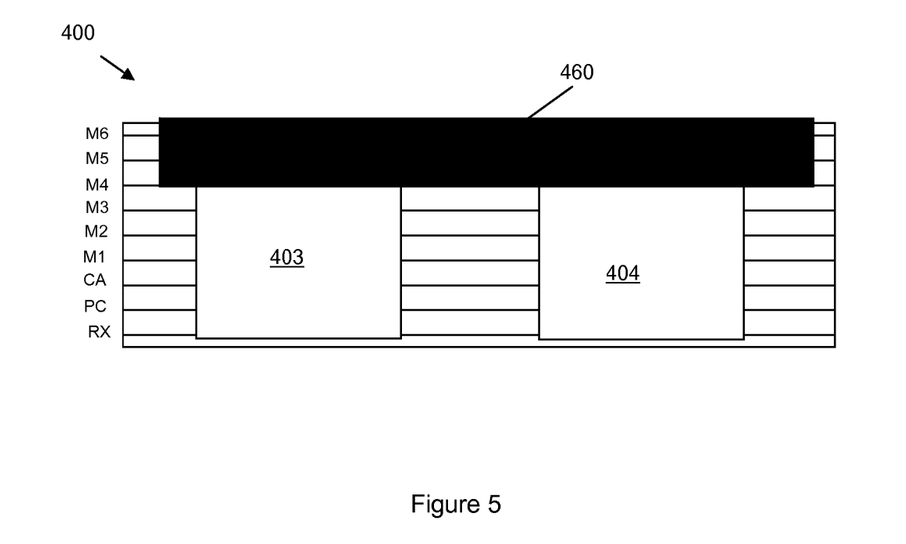
FIG. 5 is a schematic diagram illustrating a side view cross-section of the integrated circuit of FIG. 4.

Referring to FIGS. 4-5, it is also anticipated that the methodology, described above and illustrated in FIGS. 1-2, could easily support manufacturing of chips (e.g., chip 400) in which blocks 401-404 are stepped onto the chip 400 (at process 221) using customized masks and/or masks selected from the library 120, are optionally connected via a generic interface 410 (i.e., a common configurable structure that enables connections across the different blocks 401-404) (at process 222) and personalized at higher metal levels (e.g., see personalized metal 460 at metal level M4). Those skilled in the art will recognize that critical timing paths would not designed into the personalized metal level 460.

Therefore, disclosed above, are embodiments of a manufacturing method that establishes and maintains a library of pre-made and pre-qualified masks for patterning blocks of circuitry with varying structures that have established performance and timing requirements (e.g., blocks of circuitry related to specific intellectual property (IP blocks)). The masks could be built for single macros, multiple macros, or even for systems-on-chips. The method further uses stepped exposures of multiple masks, including at least one mask selected from the library, to pattern an entire chip design onto a substrate, where the chip design is made up of two or more interconnected blocks of circuitry. By using pre-made and pre-qualified masks that can be stepped separately onto the die and connected using appropriate alignment references, mask costs and turn-around-times (TATs) can be reduced.

Additionally, mask quality can be improved, as can the process yield. That is, the process yield can be improved by allowing less stringent process rules and variation for types of IP and circuits that have lower performance/timing requirements and more stringent process rules for types of IP and circuits that have higher performance/timing requirements. The disclosed invention takes the integration of IP a number of steps further into the silicon manufacturing process, from soft/hard IP (rules) to glass IP (silicon ready).

Consequently, it is anticipated that the embodiments of the invention, described above, can be used in the formation of a device with parallel multi-core processors working on a single chip. That is, it is currently possible to have devices in which 2, 4 or even more core processors (e.g., processors that contain critical circuits and high speed links communicating with memories) are found on a single chip. Implementing this invention would allow such chips to be built with more predictable yields. Additionally, in the future, it may be desirable and even possible to have many more of these core processors (e.g., over a 100) on a single chip and implementation of this invention would similarly improve the chance of successfully building such chips and of building such chips with predictable yields.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A manufacturing method comprising:
    designing multiple masks,
        wherein said masks contain patterns for corresponding blocks of circuitry with corresponding performance and timing requirements, and
        wherein said designing comprises establishing, for each of said masks, at least predetermined mask specifications and sets of rules for mask formation;
    pre-qualifying each of said masks individually with respect to said corresponding performance and timing requirements, wherein said pre-qualifying comprises:
        for each specific mask, forming said specific mask on a test chip;
        using said specific mask to form a specific block of circuitry on said test chip; and,
        electrically testing said test chip to determine whether said specific block of circuitry meets specific performance and timing requirements and, if not, repeating said designing of said specific mask;
    maintaining said masks, once pre-qualified, in a library;
    designing an integrated circuit structure with at least one block of circuitry having predetermined performance and timing requirements;
    selecting, from said library, a pre-qualified mask that corresponds to said at least one block of circuitry; and
    using said pre-qualified mask to pattern said at least one block of circuitry onto a substrate, wherein said pre-qualifying ensures that, once formed on said substrate, said at least one block of circuitry will meet said predetermined performance and timing requirements.

2. The method of claim 1, further comprising:
    before said using of said specific mask to form said specific block of circuitry, inspecting said specific mask to determine whether said specific mask meets specific predetermined mask specifications and, if not, repeating said forming of said specific mask.

3. The method of claim 1, further comprising further patterning said substrate using a second mask corresponding to a second block of circuitry, wherein said second mask is one of selected from said library, made and qualified using a standard design flow and rules set, and custom-made and qualified.

4. The method of claim 1, wherein said multiple blocks of circuitry comprise at least one of a device, a processor, a system-on-a-chip (SOC), a serial link, a memory structure, a programmable logic, a phase-locked loop, and an input/output circuit.

5. A manufacturing method comprising:
    designing multiple blocks of circuitry that can be interconnected through a generic interface in a substrate;
    designing multiple masks,
        wherein each of said masks contains a pattern for a corresponding one of said blocks of circuitry having corresponding performance and timing requirements, and
        wherein said designing comprises establishing, for each of said masks, at least predetermined mask specifications and sets of rules for mask formation;
    pre-qualifying each of said masks individually with respect to said corresponding performance and timing requirements, wherein said pre-qualifying comprises:
        for each specific mask, forming said specific mask on a test chip;
        using said specific mask to form a specific block of circuitry on said test chip; and,
        electrically testing said test chip to determine whether said specific block of circuitry meets specific performance and timing requirements and, if not, repeating said designing of said specific mask;
    maintaining said masks, once pre-qualified, in a library;
    designing an integrated circuit structure with at least two blocks of circuitry having predetermined performance and timing requirements;
    selecting, from said library, pre-qualified masks that corresponds to said at least two blocks of circuitry;
    using said pre-qualified masks to pattern said at least two blocks of circuitry onto a substrate; and
    electrically connecting said at least two blocks of circuitry using said generic interface, wherein said pre-qualifying ensures that, once formed, said at two blocks of circuitry will meet said predetermined performance and timing requirements.

6. The method of claim 5, further comprising:
    before said using of said specific mask to form said specific block of circuitry, inspecting said specific mask to determine whether said specific mask meets specific predetermined mask specifications and, if not, repeating said forming of said specific mask.

7. The method of claim 5, wherein said multiple blocks of circuitry comprise at least one of a device, a processor, a system-on-a-chip (SOC), a serial link, a memory structure, a programmable logic, a phase-locked loop, and an input/output circuit.

8. A method of manufacturing integrated circuits, said method comprising:

designing multiple masks,
- wherein said masks contain patterns for corresponding blocks of circuitry with corresponding performance and timing requirements, and
- wherein said designing comprises establishing, for each of said masks, at least predetermined mask specifications and sets of rules for mask formation;

pre-qualifying each of said masks individually with respect to said corresponding performance and timing requirements, wherein said pre-qualifying comprises;
- for each specific mask, forming said specific mask on a test chip;
- using said specific mask to form a specific block of circuitry on said test chip; and,
- electrically testing said test chip to determine whether said specific block of circuitry meets specific performance and timing requirements and, if not, repeating said designing of said specific mask;

maintaining said masks, once pre-qualified, in a library;

designing an integrated circuit comprising multiple blocks of circuitry, wherein said multiple blocks comprise at least a first block having predetermined performance and timing requirements and a second block;

selecting, from said library, a pre-qualified mask that contains a first pattern for said first block;

transferring said first pattern into a substrate using said pre-qualified mask; and transferring a second pattern for said second block into said substrate using a second mask.

9. The method of claim 8, further comprising one of selecting said second mask from said library, making said second mask, and implementing said second mask using a standard design flow and rules set.

10. The method of claim 9, wherein if at least one of timing requirements and performance requirements for said first block and said second block are different, then different sets of rules may be applied when said first mask and said second mask made.

11. The method of claim 8, wherein said designing of said integrated circuit further comprises designing said second block to have application specific logic to meet application specific requirements.

12. The method of claim 8, wherein said designing of said integrated circuit further comprises designing said second block to have programmable logic that can be programmed to meet application specific requirements.

13. The method of claim 8, wherein said designing of said integrated circuit further comprises designing said first block to have at least one of a device, a processor, a system-on-a-chip (SOC), a serial link, a memory structure, a programmable logic, a phase-locked loop, and an input/output circuit.

14. A method of manufacturing integrated circuits, said method comprising:

designing multiple masks,
- wherein said masks contain patterns for corresponding blocks of circuitry with corresponding performance and timing requirements, and
- wherein said designing comprises establishing, for each of said masks, at least predetermined mask specifications and sets of rules for mask formation;

pre-qualifying each of said masks individually with respect to said corresponding performance and timing requirements, wherein said pre-qualifying comprises:
- for each specific mask, forming said specific mask on a test chip;
- using said specific mask to form a specific block of circuitry on said test chip; and,
- electrically testing said test chip to determine whether said specific block of circuitry meets specific performance and timing requirements and, if not, repeating said designing of said specific mask;

maintaining said masks, once pre-qualified, in a library;

designing an integrated circuit comprising multiple blocks of circuitry, wherein said multiple blocks comprise at least a first block having predetermined performance and timing requirements and a second block;

selecting, from said library, a pre-qualified mask that contains a first pattern for said first block;

transferring said first pattern into a substrate using said and pre-qualified mask;

transferring a second pattern for said second block into said substrate using a second mask; and electrically connecting said first block in said substrate to said second block in said substrate.

15. The method of claim 14, further comprising one of selecting said second mask from said library, making said second mask, and implementing said second mask using a standard design flow and rules set.

16. The method of claim 14, wherein said electrically connecting comprises connecting said first block and said second block to generic interfaces in said substrate.

* * * * *